United States Patent
Kikuchi et al.

[19]

[11] Patent Number: 6,133,707
[45] Date of Patent: Oct. 17, 2000

[54] BATTERY CHARGING AND DISCHARGING CONTROL APPARATUS FOR HYBRID POWERED VEHICLE

[75] Inventors: Yoshiaki Kikuchi; Toshiyuki Sekimori; Kazuo Tojima; Yoshiyuki Nakayama, all of Toyota, Japan

[73] Assignee: Toyota Jidosha Kabushiki Kaisha, Toyota, Japan

[21] Appl. No.: 09/315,149

[22] Filed: May 20, 1999

[30] Foreign Application Priority Data

Jun. 25, 1998 [JP] Japan ................................. 10-178231

[51] Int. Cl.⁷ ................................................. H01M 10/46
[52] U.S. Cl. ........................... 320/104; 320/118; 320/136
[58] Field of Search ..................... 320/116, 118, 320/120, 122, 127, 135, 136, FOR 112, FOR 117

[56] References Cited

U.S. PATENT DOCUMENTS

| | | | |
|---|---|---|---|
| 3,707,664 | 12/1972 | Esch | 320/120 |
| 4,622,508 | 11/1986 | Mattau et al. | 320/118 |
| 5,530,336 | 6/1996 | Eguchi et al. | 320/118 |
| 5,578,915 | 11/1996 | Crouch, Jr. et al. | 320/118 X |
| 5,631,533 | 5/1997 | Imaseki | 320/118 |
| 5,880,575 | 3/1999 | Itou et al. | 320/122 |

FOREIGN PATENT DOCUMENTS

| | | |
|---|---|---|
| 195 41 595 A1 | 5/1996 | Germany . |
| 7-137612 | 5/1995 | Japan . |
| 2 319 407 | 5/1998 | United Kingdom . |

OTHER PUBLICATIONS

Kahlen, H., et al., *Battery Management with a Two Wire Bus for single Cell Charging and Measurement*, International Electrical Vehical Symposium, Oct. 13, 1996, pp. 79–83.

*Primary Examiner*—Edward H. Tso
*Attorney, Agent, or Firm*—Oliff & Berridge, PLC

[57] ABSTRACT

A voltage detector (12) detects the voltage levels of the battery blocks of the battery set (10). A presence of an overdischarged cell is detected when a voltage difference between each of the battery blocks reaches or exceeds a predetermined value (for example, 1V). At this point, a battery ECU (14) sets the SOC value of the battery set (10) at the lower control limit value (for example, 20%). This triggers an HV ECU (16) to control the load (18) such that charging is effectuated in the battery set (10). If further discharge occurs, the battery set (10) is disconnected from the load (18) by a relay (20).

6 Claims, 4 Drawing Sheets

BATTERY CHARGING AND DISCHARGING CONTROL APPARATUS FOR HYBRID POWERED VEHICLE

BACKGROUND OF THE INVENTION

1. Field of the Invention

The present invention relates to a battery control apparatus for a hybrid powered vehicle, comprising a battery set having a predetermined number of battery blocks connected in series, wherein the control apparatus is for maintaining the SOC (state of charge) of the battery at a target value using a generator driven by an engine.

2. Description of the Related Art

Hybrid vehicles provided with an engine-driven generator in addition to a motor for driving the vehicle are known. In such hybrid vehicles, a battery is provided, electricity from the battery is used to drive the drive motor, and the battery is charged with electricity from the generator. The drivemotor and the engine rotate the wheels to propel the vehicle. During normal travelling, the driving of the motor and of the generator are controlled such that the SOC of the vehicle-mounted battery is maintained close to a predetermined target value (for example, approximately 50%).

However, when such a vehicle travels under strenuous conditions, such as climbing a long slope, discharge from the battery may continue for a prolonged period of a time. In such cases, the SOC of the battery progressively decreases, possibly resulting in a drastic lowering of the battery SOC. For this reason, limit values of SOC are normally set, with the lower limit value at approximately 20% and the upper limit value at approximately 80%. For example, discharge from the battery may be inhibited when the SOC decreases below 20%, and charging of the battery inhibited when the SOC increases above 80%. The battery SOC is thus maintained at a level between 20% to 80%.

The vehicle-mounted battery referred to here is a type having an output direct current voltage of approximately 250V. Accordingly, this vehicle-mounted battery comprises a plurality of battery cells connected in series forming a battery set. Typically, a plurality of battery cells are serially connected to form a battery block, and a plurality of these battery blocks are serially connected to constitute a battery set. For example, 12 cells form one block, and 20 blocks constitute one battery set.

An SOC of a battery is typically determined by accumulation of charge and discharge amount. In a hybrid vehicle wherein the SOC is controlled to be maintained at approximately 50%, if any difference exists between the determined charge and discharge amount and the actual charge and discharge amount, the error tends to be amplified by the accumulation process over a long period of time. In addition, as the SOC of a battery set is calculated from the total charge and discharge amount of the entire set, the SOC of each battery cell may differ from the determined SOC. The operating conditions, such as temperature, are not necessarily identical for each cell, and variation in SOC values between each cell can not be prevented.

Accordingly, there may exist cases in which, while the SOC calculated from the charge and discharge amount has not decreased below 20%, the SOC of a particular cell within the battery has reached 0%. When using a battery set, discharge is continued from other battery cells even after the SOC of one battery cell has become 0%. Consequently, a discharge current continues to flow through the 0% SOC battery cell (overdischarged cell), which may cause generation of hydrogen gas in that cell.

In order to solve such problems, the inventor of the present invention proposed, in Japanese Patent Application No. Hei 9-338436, a system where 0% SOC in a battery cell is detected through determination of a voltage difference between battery cells. This technology is described below. It should be noted that the content of Japanese Patent Application No. Hei 9-338436 is not yet publicly disclosed at the time of the filing of the present application.

In a battery set comprising 200 or more battery cells, it is difficult to detect a 0% SOC in one cell from the voltage of the entire battery set. However, by determining the voltage value for each battery block comprising approximately 10 battery cells, and comparing these values, a difference of approximately 1 can be detected in a battery block containing a 0% SOC battery cell in comparison with other battery blocks.

More specifically, in normal usage status, the voltage levels of each battery block are approximately equal to each other because no 0% SOC battery cell exists. When discharge proceeds and the SOC of one battery cell becomes 0%, the voltage of this cell becomes 0V. As a result of the voltage of one cell being 0V, the voltage of the battery block containing this 0% SOC cell suddenly decreases by 1V or more. The occurrence of a 0% SOC battery cell can therefore be detected through the detection of a voltage difference of 1V or more between battery blocks.

In the invention described in Japanese Patent Application No. Hei 9-338436, output power is restricted when such 0% SOC battery cell is detected. When discharge further continues in spite of the output power restriction, the battery is disconnected and no further discharge is permitted at all.

However, the output power restriction performed in this case is a control operation for increasing the amount of charging, wherein the torque output is maintained in proportion to the amount of accelerator stepping. It was therefore possible that discharge further continues, thereby continuing the generation of hydrogen gas in the battery cell.

SUMMARY OF THE INVENTION

The purpose of the present invention is to prevent battery overdischarge.

The present invention can be configured as a battery control apparatus for a hybrid powered vehicle mounted with an engine and a motor, comprising a battery set for supplying electricity to said motor, having a plurality of battery blocks connected in series, each of said battery blocks containing a predetermined number of battery cells; a generator which is driven by said engine and supplies electricity to said battery set; an SOC detection device for detecting SOC of the battery set; a control device for controlling, in accordance with an SOC detected in said SOC detection device, the supply of electricity to the motor from said battery set and the generation of electricity in the generator; and an overdischarge detection device for detecting an overdischarge in at least one of the battery cells; wherein said control device, when an overdischarged cell is detected by said overdischarge detection device, controls the supply of electricity to the motor and the generation of electricity in the generator such that charging of said battery set is effectuated. As charging is thus effectuated when an overdischarge of a battery cell is detected, further discharge from the battery set can be prevented.

Furthermore, said overdischarge detection means may preferably determine respective voltage levels in each of the battery blocks, and detect an overdischarge in at least one battery cell through detecting that a difference between each of the determined voltage levels of the battery blocks has reached or exceeded a predetermined value. As an overdischarge of a battery cell is detected via a voltage difference between the battery blocks, an overdischarge in one cell within the battery set containing even a large number of connected battery cells can effectively be detected.

Moreover, said SOC detection device preferably supplies a predetermined low SOC value to the control device when an overdischarge is detected in said overdischarge detection device, and the control device preferably controls, in accordance with the supplied predetermined low SOC value, the supply of electricity to the motor and the generation of electricity in the generator such that the charging of the battery set is effectuated. When the SOC decreases during normal travelling, the motor drive and the electricity generation are controlled such that charging begins. Accordingly, by setting the SOC at a low value, a charging request can be generated without establishing any special processing routines.

Said predetermined low SOC value is preferably the lowest allowable value for the SOC of the battery set. The charging of the battery set can then reliably be effectuated.

If any discharge further continues due to some error, any output from the battery set is prohibited by means such as disconnecting the battery set. Any further discharge is thus assuredly prevented.

BRIEF DESCRIPTION OF THE DRAWINGS

The present invention will be further understood from the following description with reference to the accompanying drawings in which.

DESCRIPTION OF PREFERRED EMBODIMENT

An embodiment of the present invention is described below with reference to the accompanying drawings.

Figure 1:
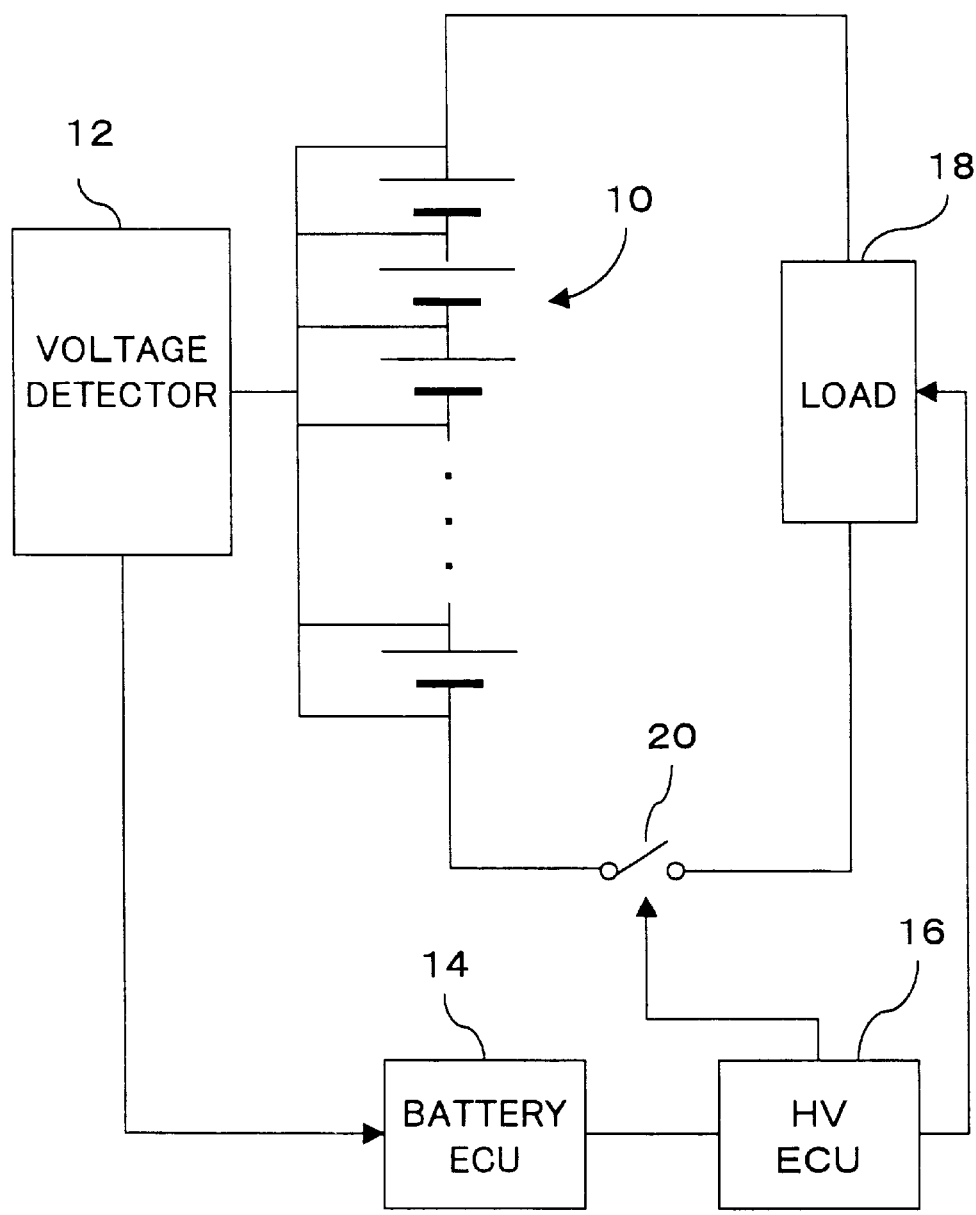
FIG. 1 is a block diagram illustrating the general structure of the present invention.

FIG. 1 is a block diagram illustrating the general structure of the present invention. The battery set 10 comprises a plurality of battery cells. In this example employing Ni-MH batteries, 240 battery cells are serially connected, and an output voltage of approximately 280V is obtained. A unit of serially-connected 12 battery cells is designated as one battery block, with the voltage detector 12 detecting respective voltage levels in each of the battery blocks. In the Figure, each battery symbol represents on battery block.

The voltage detector 12 compares the detected voltage values for each of the battery blocks to determine if a difference of 1V or greater exists. This determination can be performed by sequentially comparing the voltage levels of adjacent battery blocks and determining if the difference is 1V or more, or by determining if a difference between the average voltage value of all the battery blocks and the voltage levels of each battery block is 1V or more.

The determined result of the voltage detector 12 is supplied to the battery ECU 14. When a voltage difference between battery blocks of 1V or greater is detected, the battery ECU 14 determines that a 0% SOC battery cell exists in that battery block. In such cases, the battery ECU 14 sets the SOC value at 20%. More specifically, the battery ECU 14 is monitoring the SOC of the battery set through measurement of current in the battery set using an ammeter not shown. This monitored SOC value is set at 20% when a voltage difference of 1V or more is detected by the voltage detector 12.

The battery ECU 14 supplies the monitored SOC to HV ECU 16. In accordance with the SOC value supplied by the battery ECU, HV ECU 16 controls the operation of the load 18. This load 18 comprises items such as a drive motor, engine, generator, and inverter and the consumption of electricity from the battery set 10 is controlled by controlling the load 18. More specifically, electricity from the battery set 10 is supplied to the drive motor through the inverter. HV ECU 16 determines a target output torque of the drive motor based on factors such as the amount of accelerator stepping, and controls the inverter, and thereby the drive motor, such that the actual output torque is adjusted to the determined target output torque. In addition, the HV ECU 16 also controls the engine output power that generates the forces driving the generator and the wheels. Through such operations, the charging amount of the battery set 10 is controlled.

When the SOC is 50% or more, HV ECU 16 controls adjustments so that the amount of electricity generated by the engine output decreases, allowing discharge from the battery set 10 to progress. When the SOC is below 50%, HV ECU 16 controls adjustments so that the electricity generation by the engine output increases, allowing charging of the battery set 10 to progress. These control operations are performed at levels according to the SOC.

When the SOC value supplied by the battery ECU 14 decreases to 20%, the HV ECU 16 inhibits discharge from the battery set 10 and performs charging control operations for the battery set 10. More specifically, the HV ECU 16 controls the load 18 to inhibit the drive motor from consuming electricity in an amount exceeding that being generated by the generator. While the driving of the wheels by the engine may be maintained to a certain degree, the electricity consumption by the drive motor output is controlled not to exceed the amount generated by the generator.

By such control operations, the battery set 10 is charged to recover SOC value. Once the SOC value is set at 20%, the SOC is constantly monitored for the amount of current accumulation and, when the SOC increases, the control operation returns to normal status. It may also be desirable to continue to inhibit discharge until the SOC recovers to a predetermined value, for example, 30%. A charge request is generated when the SOC reaches the lower control limit value (for example, 20%), even during normal operation. Accordingly, by setting the SOC at the lower control limit value, a charging request can be generated without requiring any special processing routine.

Figure 2:
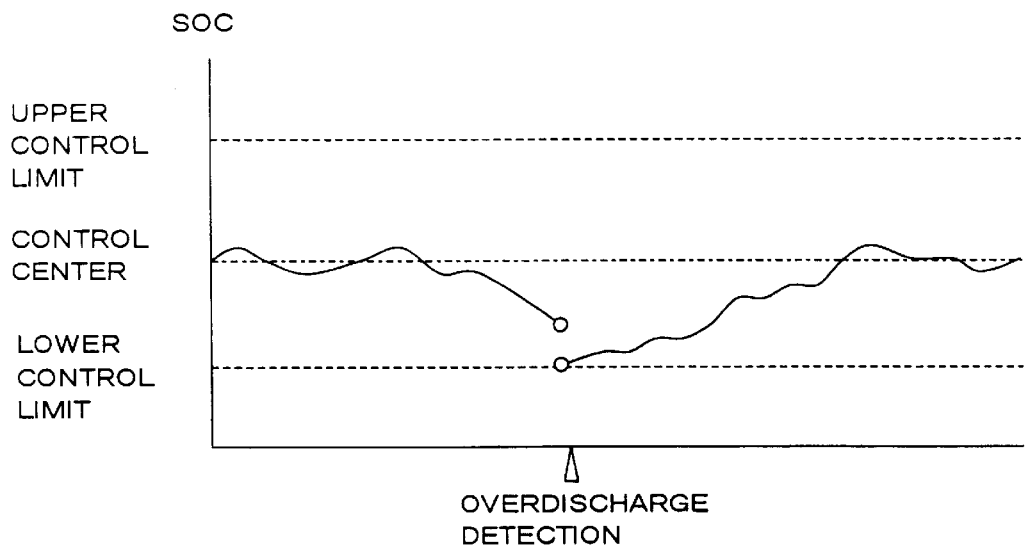
FIG. 2 is a diagram showing an example of state of variation in an SOC.

An example of such control operations is shown in FIG. 2. During normal travelling, the SOC is maintained at around 50%. The SOC is to be set at 20% when a sudden voltage decrease of 1V or more is detected in any one of the battery blocks via the values detected by the voltage detector 12. Such a condition may likely occur when the SOC was somewhat reduced due to, for example, travelling upward on a slope. By setting the SOC value at 20%, HV ECU 16 controls the load 18 such that charging is effectuated in the battery set 10, thereby recovering the SOC in the battery set 10.

The SOC in the battery set 10 may continue to decrease despite of the control operations by the HV ECU 16 if there is, for example, an instrument malfunction. If discharge continues in such conditions, an overdischarge proceeds in the 0% SOC battery cell. The internal pressure of the battery cell then increases, possibly causing an internal liquid to leak.

When a predetermined amount of discharge after reaching 20% SOC is detected through current accumulation by the battery ECU 14, HV ECU 16 controls the relay 20 to disconnect the battery set 10 from the load 18. Discharge from the battery set 10 is thereby completely stopped, prohibiting any further discharge.

Figure 3:
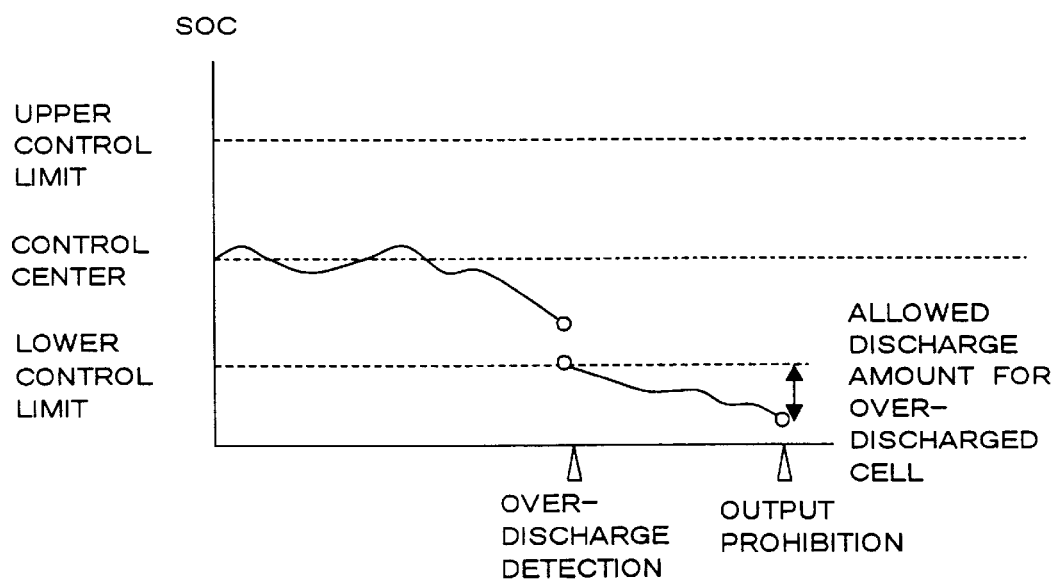
FIG. 3 is a diagram showing another example of state of variation in an SOC.

FIG. 3 illustrates how, when a predetermined amount of discharge is executed after the SOC value is set at 20%, the relay 20 is controlled to prohibit battery output.

Figure 4:
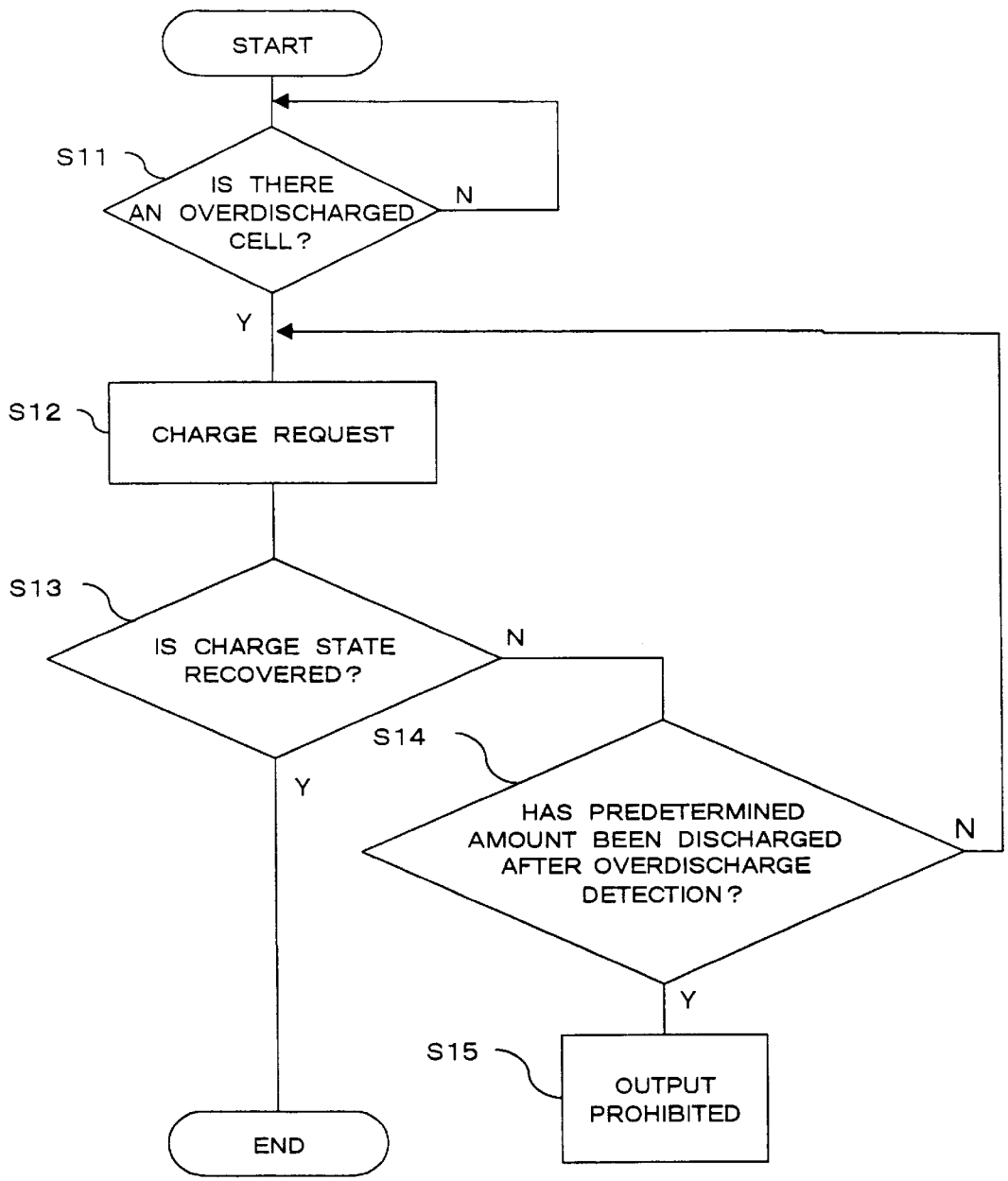
FIG. 4 is a flow chart illustrating the processing operations according to the present invention.

FIG. 4 is a flowchart illustrating the above-described control operations. First, the battery ECU 14 determines by the output from the voltage detector 12 whether an overdischarged cell is present (S11). While, in the embodiment described above the determination was based on whether a voltage difference between battery blocks was 1V or more, the determination may also be conducted through detecting the voltage levels of each of the battery cells. Alternatively, overdischarge may be detected via a pressure increase in a battery cell.

When an overdischarged cell is detected, a charge request is made to the load 18 (S12). While, in the above embodiment, this charge request was generated by setting the SOC value at 20%, a control operation for inhibiting discharge may be performed without any relation to SOC setting. By performing such an operation, the SOC of the battery set 10 should recover.

It is then determined whether or not the state of charge has actually recovered (S13). If recovered, the processing is completed and returns to the determining step of S11. If, on the other hand, the answer to S13 remains "no", it is determined after the charge request is generated as to whether a predetermined amount of discharge has occurred after the overdischarge detection (S14). If a predetermined amount of discharge did occur for some reason, the relay 20 is disconnected to prohibit any output from the battery (S15). With such processing, a charge request can automatically be generated inhibiting further discharge when an overdischarged cell is detected. In addition, when further discharge occurs because of some error, a complete prohibition of discharge can be effectuated by disconnecting the battery set 10 from the load 18.

Figure 5:
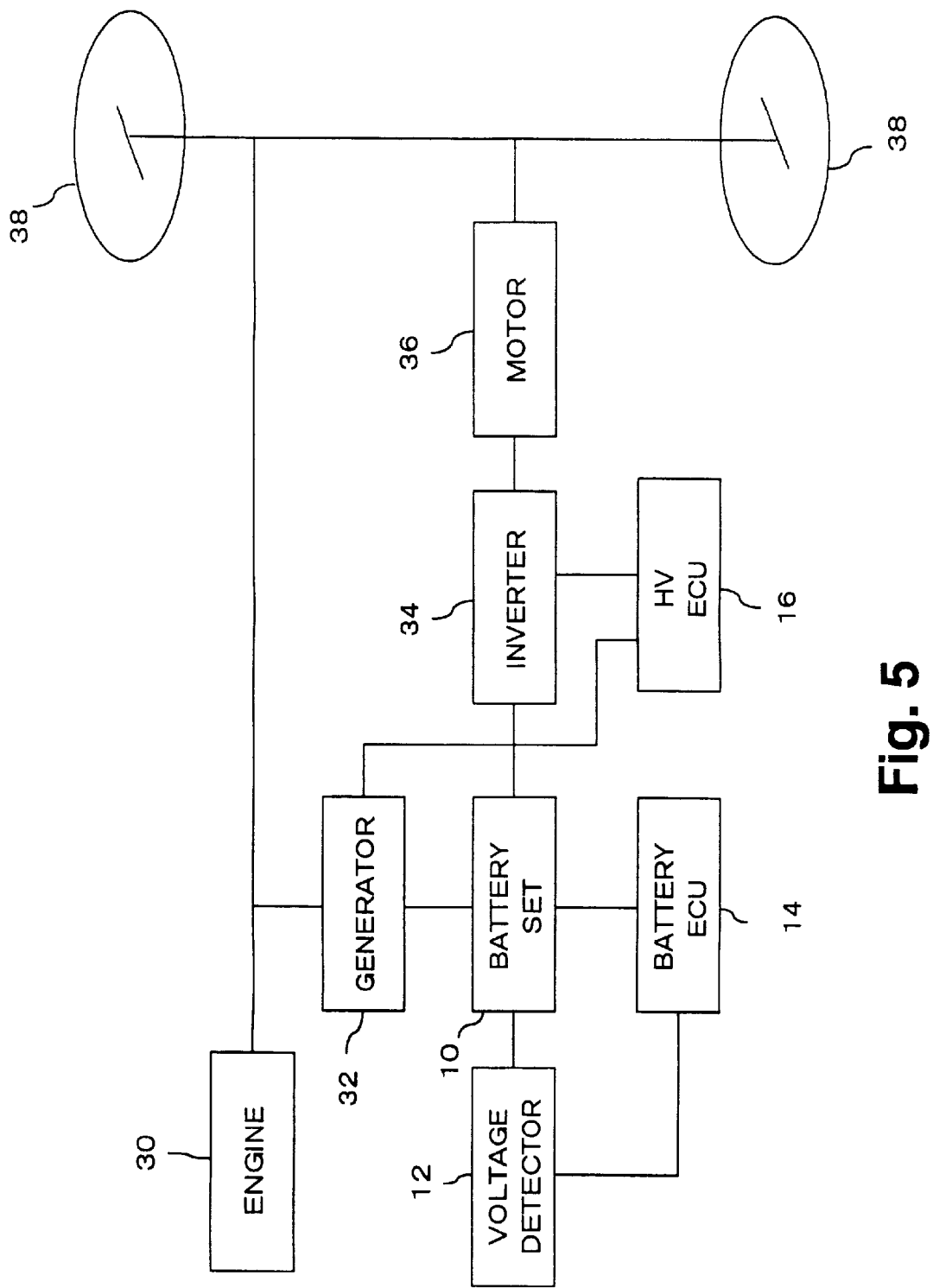
FIG. 5 is a block diagram showing the structure of a hybrid vehicle.

FIG. 5 illustrates a general structure of a hybrid vehicle. As shown, a generator 32 is connected to the engine 32. Electricity generation by the generator 32 is performed using the output power of the engine 30. The battery set 10 is connected to receive the output from the generator 32, allowing the battery set 10 to be charged by the generator 32. A motor 36 is connected via an inverter 34 to receive an output from the battery set 10, and is thereby driven by the electricity from the battery set 10. Wheels 38 are connected to the motor 36. These wheels 38 are driven to be rotated by the output of the motor 36, allowing the hybrid vehicle to travel. As the wheels 38 are similarly connected to the engine 30, the wheels 38 are also driven to be rotated by the output of the engine 30, resulting in the travel of the hybrid vehicle.

As described above, the present invention, upon detection of the presence of an overdischarged cell, generates a charge request and inhibits further discharge, thereby recovering the state of charge of the battery. Especially, by determining the voltage differences between each of the battery blocks, the presence of an overdischarged cell can effectively be detected. In addition, a charge request can easily be performed employing a routine used in normal status by requesting charging through setting of the detected SOC value at the lower limit value. Furthermore, the battery is disconnected if a predetermined amount of discharge occurs after the generation of the charge request, assuring that further discharge from the battery will be prevented when events, such an error in the control system, occur.

What is claimed is:

1. A battery control apparatus for a hybrid powered vehicle mounted with an engine and a motor, comprising:

a battery set for supplying electricity to said motor, having a plurality of battery blocks connected in series, each of said battery blocks containing a predetermined number of battery cells;

a generator which is driven by said engine and supplies electricity to said battery set;

an SOC detection device for detecting SOC of the battery set;

a control device for controlling, in accordance with an SOC detected in said SOC detection device, the supply of electricity to the motor from said battery set and the generation of electricity in the generator; and an overdischarge detection device for detecting an overdischarge in at least one of the battery cells; wherein said control device controls the supply of electricity to the motor and the generation of electricity in the generator when an overdischarged cell is detected by said overdischarge detection device such that charging of said battery set is effectuated.

2. The apparatus according to claim 1, wherein said overdischarge detection means determines respective voltage levels in each of the battery blocks, and determines that at least one battery cell is overdischarged when it detects that a difference between each of the determined voltage levels of the battery blocks has reached or exceeded a predetermined value.

3. The apparatus according to claim 1, wherein said SOC detection device supplies a predetermined low SOC value to the control device when an overdischarge is detected in said overdischarge detection device, while the control device controls, in accordance with the supplied predetermined low SOC value, the supply of electricity to the motor and the generation of electricity in the generator such that charging of the battery set is effectuated.

4. The apparatus according to claim 3, wherein said predetermined low SOC value is the lowest allowable value for the SOC of the battery set.

5. The apparatus according to claim 1, wherein any output from the battery set is prohibited when the detected SOC further lowers after the voltage difference between each of the battery blocks detected by said voltage detection device reaches or exceeds a predetermined value.

6. The apparatus according to claim 5, wherein the prohibition of output from said battery set is executed by disconnecting an electrical connection between the battery set and the motor.

* * * * *